United States Patent
Chidambaram et al.

(10) Patent No.: US 6,465,307 B1
(45) Date of Patent: Oct. 15, 2002

(54) METHOD FOR MANUFACTURING AN ASYMMETRIC I/O TRANSISTOR

(75) Inventors: P R Chidambaram, Richardson, TX (US); John A. Rodriguez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/997,951

(22) Filed: Nov. 30, 2001

(51) Int. Cl.$^7$ .............................................. H01L 21/336
(52) U.S. Cl. ..................... 438/286; 438/257; 438/258; 438/275; 438/279; 438/981
(58) Field of Search ................................ 438/257, 258, 438/275, 279, 981, 286

(56) References Cited

U.S. PATENT DOCUMENTS

| | | | |
|---|---|---|---|
| 5,580,804 A | * 12/1996 | Joh | 438/231 |
| 5,789,787 A | * 8/1998 | Kadosh et al. | 257/344 |
| 5,801,416 A | 9/1998 | Choi et al. | 257/335 |
| 5,989,962 A | * 11/1999 | Holloway et al. | 224/542 |
| 6,025,234 A | * 2/2000 | Chou | 438/221 |
| 6,063,670 A | * 5/2000 | Lin et al. | 257/406 |
| 6,087,223 A | * 7/2000 | Ra | 438/260 |
| 6,110,783 A | * 8/2000 | Burr | 438/286 |
| 6,194,270 B1 | * 2/2001 | Bottini et al. | 257/321 |
| 6,200,863 B1 | 3/2001 | Xiang et al. | 438/286 |
| 6,221,716 B1 | * 4/2001 | Lee et al. | 438/257 |
| 6,261,978 B1 | * 7/2001 | Chen et al. | 438/224 |

OTHER PUBLICATIONS

"Asymmetric Source/Drain Extension Transistor Structure for High Performance Sub–50nm Gate Length CMOS Devices," T. Ghani, K. Mistry, P. Packan, M. Armstrong, S. Thompson, S. Tyagi, M. Bohr, Portland Technology Development, TCAD, Intel Corporation, Hillsboro (2001 Symposium on VLSI Technology Digest of Technical Papers, p. 17).

"Asymmetrically–Doped Buried Layer (ADB) Structure for Low–Voltage Mixed Analog–Digital Applications," Masafumi Miyamoto, Kenji Toyota, Koichi Seki, and Takahiro Nagano, Semiconductor Development Center, Central Research Laboratory, Hitachi, Ltd. 1–280, Higashi–koigakubo, Kokubuni, Tokyo 185, Japan (1996 Symposium on VLSI Technology Digest of Technical Papers, p. 102).

"Graded Gate VDMOSFET," Shuming Xu, Kian Paau Gan, Pang Dow Foo, Yi Su, and Yong Liu (IEEE Electron Device Letters, vol. 21, No. 4, Apr. 2000).

(List continued on next page.)

*Primary Examiner*—John F. Niebling
*Assistant Examiner*—Jennifer M. Kennedy
(74) *Attorney, Agent, or Firm*—Jacqueline J. Garner; W. James Brady, III; Frederick J. Telecky, Jr.

(57) ABSTRACT

According to one embodiment of the invention, a method of forming an asymmetric I/O transistor includes forming a first oxide layer outwardly from a semiconductor substrate, masking a first portion, less than a whole portion, of an I/O transistor region with a first photoresist layer, removing the first oxide layer from a core transistor region and a second portion of the I/O transistor region, removing the first photoresist layer, forming a second oxide layer outwardly from the substrate, forming gates for the core transistor region and the I/O transistor region, masking the first portion of the I/O transistor region with a second photoresist layer, doping a source region and a drain region of the core transistor region and a source region of the I/O transistor region with a first dopant, doping the source region and the drain region of the core transistor region and the source region of the I/O transistor region with a second dopant, removing the second photoresist layer, masking the core transistor region and the second portion of the I/O transistor region with a third photoresist layer, and doping a drain region of the I/O transistor region with a third dopant.

19 Claims, 2 Drawing Sheets

OTHER PUBLICATIONS

"Lateral Thinking About Power Devices (LDMOS)," Taylor R. Efland, Chin–Yu Tsai, Sameer Pendharkar (Power Device Development, Mixed Signal Productization, Texas Instruments Incorporated, Dallas, Texas, USA).

"RF LDMOSFET with Graded Gate Structure," Xu, Shuming, and Foo, Pan Dow (Institute of Microelectronics, 10 Science Park Road, #02–19/26 (The Alpha, Singapore Science Park II, Singapore 117684, p. 221).

"Transistor Design Issues in Integrating Analog Functions with High Performance Digital CMOS," A. Chatterjee, K. Vasanth, D. T> Grider, M. Nandakumar, G. Pollack, R. Aggarwal, M. Rodder and H. Schichijo (Silicon Technology Development, Texas Instruments, Dallas, USA, p. 11A–1).

* cited by examiner

METHOD FOR MANUFACTURING AN ASYMMETRIC I/O TRANSISTOR

TECHNICAL FIELD OF THE INVENTION

This invention relates generally to the field of semiconductor devices and, more specifically, to a method for manufacturing an asymmetric input/output ("I/O") transistor.

BACKGROUND OF THE INVENTION

Semiconductor devices are used for many applications. One component used extensively in semiconductor devices is a transistor. There are many different types of transistors, including core transistors and input/output ("I/O") transistors. Typically, core transistors exist in a center region of a semiconductor chip while I/O transistors are dispersed around the perimeter of the chip. Additionally, core transistors usually run at a lower voltage than I/O transistors. The performance of I/O transistors is important for chip manufacturers to be competitive in the networking chip business (such as chips for routers).

SUMMARY OF THE INVENTION

According to one embodiment of the invention, a method of forming an asymmetric input/output ("I/O") transistor includes providing a semiconductor substrate having a core transistor region and an I/O transistor region, forming a first oxide layer outwardly from the semiconductor substrate, masking a first portion, less than a whole portion, of the I/O transistor region with a first photoresist layer, removing the first oxide layer from the core transistor region and a second portion of the I/O transistor region, removing the first photoresist layer, forming a second oxide layer outwardly from the substrate in the core transistor region and the second portion of the I/O transistor region and outwardly from the first oxide layer in the first portion of the I/O transistor region, forming a polysilicon layer outwardly from the second oxide layer, removing a portion of the polysilicon layer, the second oxide layer, and the third oxide layer to form gates for the core transistor region and the I/O transistor region, masking the first portion of the I/O transistor region with a second photoresist layer, doping a source region and a drain region of the core transistor region and a source region of the I/O transistor region with a first dopant, doping the source region and the drain region of the core transistor region and the source region of the I/O transistor region with a second dopant, removing the second photoresist layer, masking the core transistor region and the second portion of the I/O transistor region with a third photoresist layer, and doping a drain region of the I/O transistor region with a third dopant.

Embodiments of the invention provide a number of technical advantages. Embodiments of the invention may include all, some, or none of these advantages. For example, having an asymmetric input/output transistor may produce more drive current as well as improve the channel-hot carriers ("CHC") lifetime because of the graded drain profile. In some embodiments, a chip designer may be able to tailor the off current, $I_{off}$.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Embodiments of the present invention and their advantages are best understood by referring now to FIGS. 1 through 3G of the drawings, in which like numerals refer to like parts.

Figure 1:
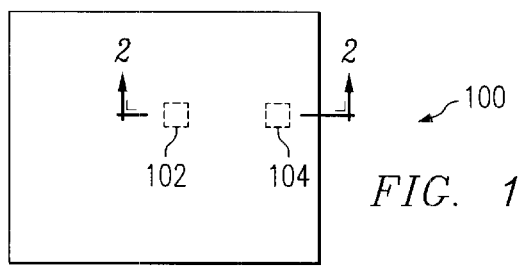
FIG. 1 is a plan view of a semiconductor chip having a core transistor and an asymmetric input/output ("I/O") transistor manufactured according to the teachings of the present invention.

FIG. 1 is a plan view of a semiconductor chip 100 having a core transistor 102 and an asymmetric input/output ("I/O") transistor 104 manufactured according to the teachings of the present invention. Semiconductor chip 100 represents any suitable semiconductor chip having any number of interconnected microelectronic devices formed therein, such as transistors, diodes, resistors and capacitors. Only a single core transistor 102 and a single asymmetric I/O transistor 104 is illustrated in FIG. 1 for clarity of description purposes. Typically, semiconductor chip 100 has hundreds of thousands or even millions of core transistors 102 and asymmetric I/O transistors 104. Both core transistor 102 and asymmetric I/O transistor 104 may be any suitable type of transistor, such as an NMOS transistor or a PMOS transistor. Although core transistor 102 is shown generally in a center region of semiconductor chip 100 and asymmetric I/O transistor 104 is shown generally in an outer region of semiconductor chip 100, both core transistor 102 and asymmetric I/O transistor 104 may be in any suitable location on semiconductor chip 100.

Figure 2:
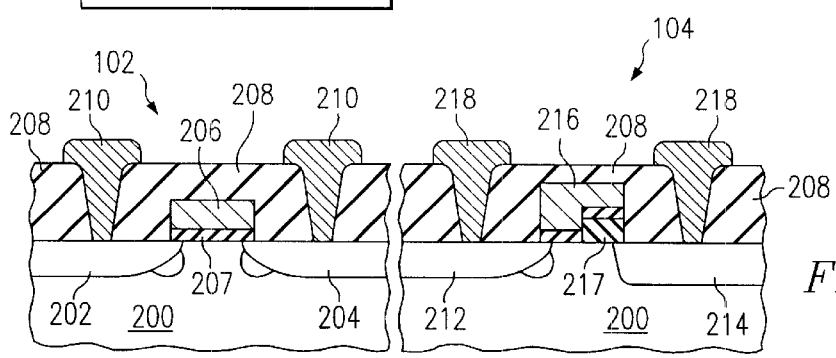
FIG. 2 is a partial cross-sectional view of the core transistor and the asymmetric I/O transistor of FIG. 1.

FIG. 2 is a partial cross-sectional view of core transistor 102 and asymmetric I/O transistor 104 illustrating more details of core transistor 102 and asymmetric I/O transistor 104. The break lines shown in FIG. 2 illustrate that core transistor 102 and asymmetric I/O transistor 104 may not be adjacent to one another in semiconductor chip 100 (although in some instances they are). As illustrated, core transistor 102 includes a substrate 200, a source 202, a drain 204, and a gate 206 disposed outwardly from a gate oxide 207. Core transistor 102 may also include a dielectric layer 208 and a pair of contacts 210. Asymmetric I/O transistor 104 includes substrate 200, a source 212, a drain 214, and a gate 216 disposed outwardly from a gate oxide 217. Asymmetric I/O transistor 104 may also have dielectric layer 208 and its own pair of contacts 218. Both core transistor 102 and asymmetric I/O transistor 104 may have other layers, or different layers, of material disposed outwardly therefrom; however, these layers are not shown for clarity of description purposes.

Substrate 200 is formed from any suitable semiconductor material used in semiconductor chip fabrication, such as silicon and germanium. Substrate 200 may be any suitable n-type or p-type substrate and may have any suitably doped regions depending on the type of transistors being fabricated. Substrate 200 may have any suitable thickness.

Source 202 and drain 204 may by any suitably doped regions in substrate 200, such as n-type doped regions and/or p-type doped regions. Source 202 and drain 204 may each have any suitable depth and any suitable profile. The formation of one embodiment of source 202 and drain 204 is described in more detail below in conjunction with FIGS. 3A through 3G.

Gate 206 is any suitably shaped gate formed from any suitable material, such as polysilicon. Gate 206 is separated from substrate 200 by gate oxide 207, which may be any suitable type of oxide and formed using any suitable growth and/or deposition technique used in semiconductor processing. The formation of gate 206 and gate oxide 207 is also described in more detail below in conjunction with FIGS. 3A through 3G.

Dielectric layer 208 comprises any suitable type of dielectric, such as oxide or nitride, and is formed using any suitable growth and/or deposition technique used in semiconductor processing. In the illustrated embodiment, dielectric layer 208 functions to electrically insulate core transistor 102 from metal contacts 210; however, dielectric layer 208 may be used for any desired purpose, and may have any suitable thickness.

Metal contacts 210 function to electrically connect source 202 or drain 204 to other microelectric devices formed in semiconductor chip 100. Metal contacts 210 may be formed from any suitable material, such as copper and aluminum, and may be formed in any suitable pattern in semiconductor chip 100.

Source 210 and drain 214 of asymmetric I/O transistor 104 may by any suitably doped regions in substrate 200, such as n-type doped regions and/or p-type doped regions. According to the teachings of the present invention, source 212 and drain 214 are manufactured with different depths and/or profiles to facilitate the asymmetry of asymmetric I/O transistor 104. However, source 210 and drain 214 may each have any suitable depth and any suitable profile. Having I/O transistors that are asymmetric improves their performance, which semiconductor chip manufacturers desire.

Gate 216 is any suitably shaped gate formed from any suitable material, such as polysilicon. Gate 216 is separated from substrate 200 by gate oxide 217, which may be any suitable type of oxide and formed using any suitable growth and/or deposition technique used in semiconductor processing. In the illustrated embodiment, gate oxide 217 is asymmetric, which may improve the performance of asymmetric I/O transistor 104. In other embodiments, gate oxide 217 is symmetric. The formation of gate 216 and gate oxide 217 is described in more detail below in conjunction with FIGS. 3A through 3G.

Metal contacts 218, similar to metal contacts 210, function to electrically connect source 212 or drain 214 to other microelectric devices formed in semiconductor chip 100. Metal contacts 218 may be formed from any suitable material, such as copper and aluminum, and may be formed in any suitable pattern in semiconductor chip 100.

FIGS. 3A through 3G are a series of cross-sectional views illustrating various manufacturing stages of core transistor 102 and asymmetric I/O transistor 104 in accordance with the teachings of the present invention. Similar to FIG. 2 above, the break lines shown in FIGS. 3A through 3G illustrate that core transistor 102 and asymmetric I/O transistor 104 may or may not be adjacent to one another in semiconductor chip 100.

Figure 3A:
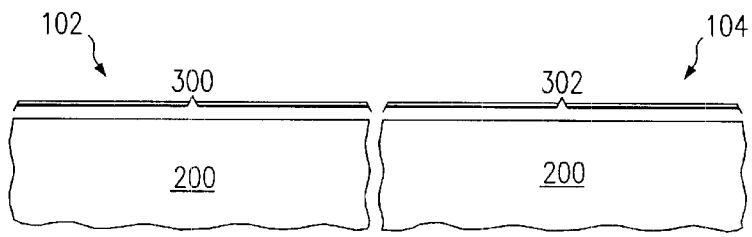
FIGS. 3A through 3G are a series of cross-sectional views illustrating various manufacturing stages of a core transistor and an asymmetric input/output ("I/O") transistor in accordance with the teachings of the present invention.

FIG. 3A illustrates substrate 200 having a core transistor region 300 and an I/O transistor region 302. Core transistor region 300 depicts a location in substrate 200 where core transistor 102 is to be fabricated. Similarly, I/O transistor region 302 depicts a location in substrate 200 where asymmetric I/O transistor 104 is to be fabricated.

Figure 3B:
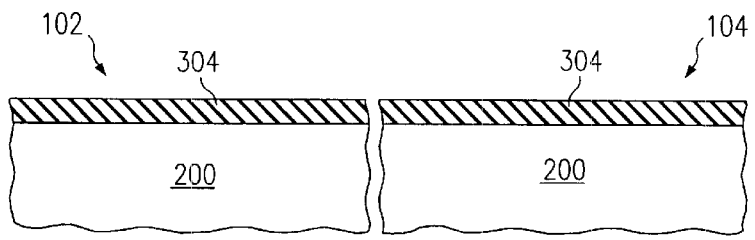

FIG. 3B shows a first oxide layer 304 formed outwardly from substrate 200. First oxide layer 304 may be any type of oxide and may be formed using any growth and/or deposition technique used in semiconductor processing. First oxide layer 304 is used to form gate oxide 217 of asymmetric I/O transistor 104, as described in further detail below. First oxide layer 304 may have any suitable thickness; however, a typical thickness for first oxide layer 304 is between 30 angstroms and 50 angstroms.

Figure 3C:
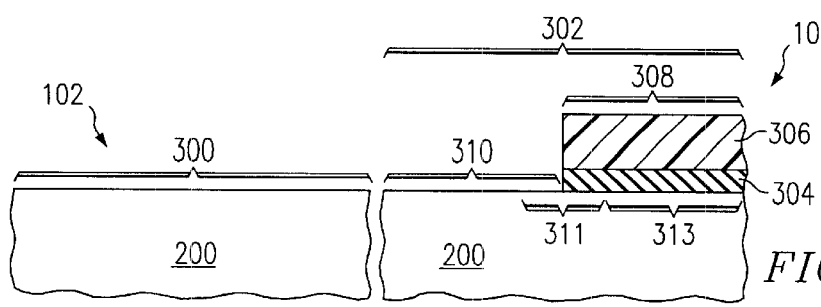

FIG. 3C shows a photoresist layer 306 masking a first portion 308 of I/O transistor region 302. Photoresist layer 306 is formed from any suitable photoresist material by any suitable photolithography technique. According to the teachings of the present invention, first portion 308 is less than the whole portion of I/O transistor region 302 so as to obtain asymmetry of asymmetric I/O transistor 104. In one embodiment, masking of first portion 308 of I/O transistor region 302 includes masking a portion of a gate region 311 of I/O transistor region 302 and masking a drain region 313 of I/O transistor region 302. This portion of gate region 311 may be the whole portion of gate region 311 or something less than the whole portion. In a particular embodiment, the portion of gate region 311 that is masked by photoresist layer 306 is approximately one-half of gate region 311. FIG. 3C also illustrates that first oxide layer 304 has been removed from core transistor region 300 and a second portion 310 of I/O transistor region 302. As illustrated, second portion 310 of I/O transistor region 302 is the whole portion minus first portion 308. The removal of first oxide layer 304 may be performed using any suitable etching process; however, in one embodiment, wet etching is performed using hydrofluoric acid.

Figure 3D:
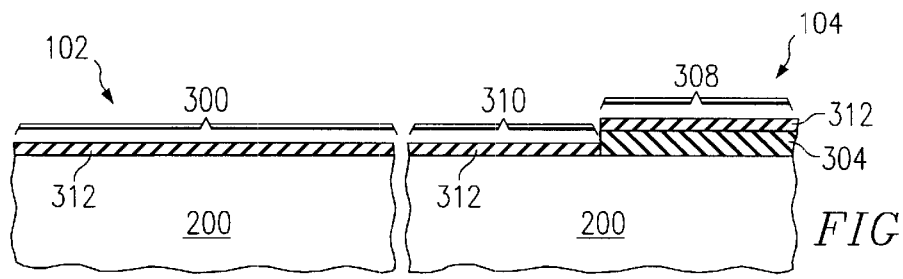

FIG. 3D shows that photoresist layer 306 has been removed and also shows the formation of a second oxide layer 312 outwardly from substrate 200 in core transistor region 300 and second portion 310 of I/O transistor region 302 and outwardly from first oxide layer 304 in first portion 308 of I/O transistor region 302. Similar to first oxide layer 304 above, second oxide layer 312 may be any type of oxide, and may be formed using any growth and/or deposition technique used in semiconductor processing. Second oxide layer 312 is used in the formation of gate oxide 207 of core transistor 102 and in the formation of gate oxide 217 of asymmetric I/O transistor 104. Second oxide layer 312 may have any suitable thickness; however, a typical thickness for second oxide layer 312 is between 15 angstroms and 25 angstroms.

Figure 3E:
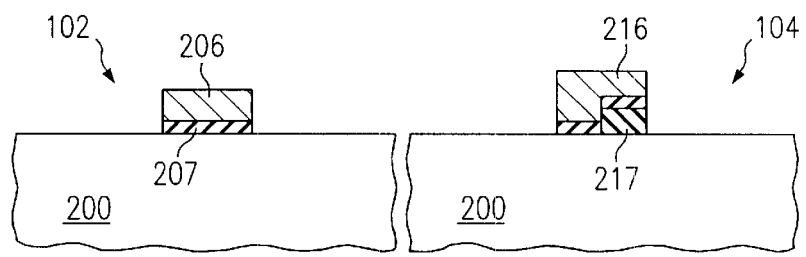

FIG. 3E shows the formation of gate 206 of core transistor 102 and the formation of gate 216 of asymmetric I/O transistor 104. Gates 206, 216 are formed by depositing a polysilicon layer outwardly from second oxide layer 312 before etching a portion of the polysilicon layer, second oxide layer 312, and first oxide layer 304 to form gates 206, 216. Any suitable photolithographic and etching techniques may be utilized to form gates 206, 216. As illustrated in FIG. 3E, gate oxide 217 is asymmetric. According to the teachings of one embodiment of the present invention, a portion of gate oxide 217 is thicker than another portion as a result of the masking step as described above in conjunction with FIG. 3C. The edge of photoresist layer 306 (FIG. 3C) determines the asymmetry of gate oxide 217, which may improve the performance of asymmetric I/O transistor 104. In other embodiments, gate oxide 217 is symmetric, thereby resulting in a substantially uniform thickness.

Figure 3F:
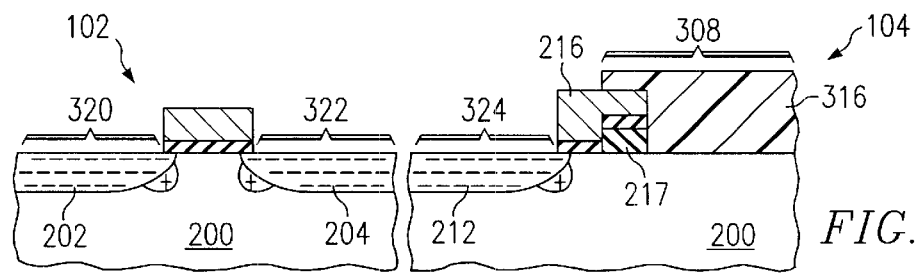

FIG. 3F illustrates a lightly doped drain ("LDD") core implant. First, a second photoresist layer 316 masks first portion 308 of I/O transistor region 302. Any suitable photolithographic technique may be utilized to mask first portion 308. After masking first portion 308, a first implantation process is performed by doping a source region 320, a drain region 322, and a source region 324 with a first dopant. This first dopant may be an n-type dopant (as denoted in FIG. 3F by the "−" symbols), such as arsenic, phosphorus and antimony, or maybe a p-type dopant, such as boron. This first implantation process for the LDD core implant is typically a shallow implant performed at an energy level of between 1 and 10 kiloelectron volts ("keV"). Other suitable implantation energies may be utilized as well as any suitable concentrations of dopant.

After the first implantation is performed, a second implantation process is performed by doping source region 320, drain region 322, and source region 324 with a second dopant. As in the case for the first dopant, the second dopant may be any suitable n-type dopant, such as arsenic, phosphorus and antimony, or maybe a p-type dopant, such as boron. In the illustrated embodiment, a p-type dopant (as denoted in FIG. 3F by the "+" symbols) is used because the first implantation process used an n-type dopant. Conversely, if a p-type dopant is performed in the first stage of the LDD core implant, then an n-type dopant is implanted in the second stage. This second implantation step of the LDD core implant is sometimes referred to as a "halo implant" and is typically performed at an energy of between 10 and 50 keV at an angle of between 7 and 30 degrees. However, other suitable implantation energies and angles may be utilized. In addition, any suitable dopant concentration may be used. After the LDD core implant is performed, source 202 and drain 204 of core transistor 102 are completed as shown and source 212 of asymmetric I/O transistor 104 is completed as shown.

Figure 3G:
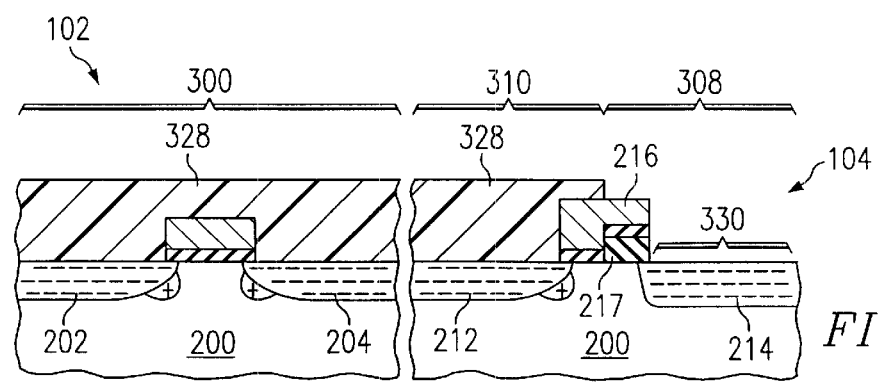

FIG. 3G illustrates a lightly doped drain ("LDD") I/O implant. First, a photoresist layer 328 masks core transistor region 300 and second portion 310 of I/O transistor region 302. Any suitable photolithographic techniques may be used to deposit photoresist layer 328 and open up first portion 308 of I/O transistor region 302. After masking core transistor region 300 and second portion 310 of I/O transistor region 302, an implantation process is performed by doping a drain region 330 with a dopant. Any suitable n-type dopant, such as arsenic, phosphorous, and antimony may be used, or any suitable p-type dopant, such as boron may be used. This LDD I/O implant is typically of a lower dose than the shallow implant for the LDD core implant as described above but is typically of the same species. In other words, if arsenic is implanted during the first implantation process of the LDD core implant above, then arsenic is typically implanted here. In one embodiment, an energy of implantation is between 5 and 20 keV. However, other suitable implantation energies and doses may be utilized.

After the LDD I/O implant, drain 214 of asymmetric I/O transistor 104 is completed as shown. Then photoresist layer 328 may be removed by any suitable etching process, and the completion of semiconductor chip 100 accomplished via any suitable back-end processing depending on the circuitry required for semiconductor chip 100. As illustrated in FIG. 3G, source 212 is shallower than drain 214, thereby creating asymmetric I/O transistor 104. Having asymmetric I/O transistor 104 for semiconductor chip 100 improves the performance of asymmetric I/O transistor 104, which improves the performance of semiconductor chip 100.

Although example embodiments of the invention and their advantages are described in detail, a person skilled in the art could make various alterations, additions, and/or omissions without departing from the spirit and scope of the present invention as defined by the appended claims.

What is claimed is:

1. A method of forming an asymmetric input/output ("I/O") transistor, comprising:
   providing a semiconductor substrate having a core transistor region and an I/O transistor region;
   forming a first oxide layer outwardly from the semiconductor substrate;
   masking a first portion of the I/O transistor region with a photoresist layer, the first portion less than a whole portion wherein masking the first portion of the I/O transistor region comprises masking a portion of a gate region of the I/O transistor region, the portion of the gate region being less than a whole portion, and masking a drain region of the I/O transistor;
   removing the first oxide layer from the core transistor region and a second portion of the I/O transistor region, the second portion less than the whole portion;
   removing the photoresist layer; and
   forming a second oxide layer outwardly from the substrate in the core transistor region and the second portion of the I/O transistor region, and outwardly from the first oxide layer in the first portion of the I/O transistor region.

2. The method of claim 1, wherein forming the first oxide layer comprises depositing oxide having a thickness of between 30 and 50 angstroms.

3. The method of claim 1, wherein masking the portion of the gate region of the I/O transistor region comprises masking half of the gate region of the I/O transistor region.

4. The method of claim 1, wherein forming the second oxide layer comprises depositing oxide having a thickness of between 15 and 25 angstroms.

5. The method of claim 1, further comprising forming the first oxide layer with a thickness of approximately twice that of the second oxide layer.

6. A method of forming an asymmetric input/output ("I/O") transistor, comprising:
   providing a semiconductor substrate having a core transistor region and an I/O transistor region;
   forming a first oxide layer outwardly from the semiconductor substrate;
   masking a first portion of the I/O transistor region with a first photoresist layer, the first portion less than a whole portion;
   removing the first oxide layer from the core transistor region and a second portion of the I/O transistor region, the second portion less than the whole portion;
   removing the first photoresist layer;
   forming a second oxide layer outwardly from the substrate in the core transistor region and the second portion of the I/O transistor region, and outwardly from the first oxide layer in the first portion of the I/O transistor region;
   forming a polysilicon layer outwardly from the second oxide layer;
   removing a portion of the polysilicon layer, the second oxide layer, and the first oxide layer to form gates for the core transistor region and the I/O transistor region;
   masking the first portion of the I/O transistor region with a second photoresist layer;
   doping a source region and a drain region of the core transistor region and a source region of the I/O transistor region with a first dopant;

doping the source region and the drain region of the core transistor region and the source region of the I/O transistor region with a second dopant;

removing the second photoresist layer;

masking the core transistor region and the second portion of the I/O transistor region with a third photoresist layer; and doping a drain region of the I/O transistor region with a third dopant.

7. The method of claim 6, wherein forming the first oxide layer comprises depositing oxide having a thickness of between 30 and 50 angstroms.

8. The method of claim 6, wherein masking the first portion of the I/O transistor region comprises masking a portion of a gate region of the I/O transistor region, the portion of the gate region being less than a whole portion, and masking a drain region of the I/O transistor.

9. The method of claim 8, wherein masking the portion of the gate region of the I/O transistor region comprises masking half of the gate region of the I/O transistor region.

10. The method of claim 6, wherein forming the second oxide layer comprises depositing oxide having a thickness of between 15 and 25 angstroms.

11. The method of claim 6, further comprising forming the first oxide layer with a thickness of approximately twice that of the second oxide layer.

12. The method of claim 6, wherein doping the source region and the drain region of the core transistor region and the source region of the I/O transistor region with the first dopant comprises implanting the first dopant in the source region and the drain region of the core transistor region and in the source region of the I/O transistor region at an energy level of between one to ten keV.

13. The method of claim 6, wherein doping the source region and the drain region of the core transistor region and the source region of the I/O transistor region with a second dopant comprises implanting the second dopant in the source region and the drain region of the core transistor region and in the source region of the I/O transistor region at an energy level of between ten to fifty keV and at an angle of between seven to thirty degrees.

14. The method of claim 6, wherein doping the drain region of the I/O transistor region with the third dopant comprises implanting the third dopant in the drain region of the I/O transistor region at an energy level of between five to twenty keV.

15. A method of forming an asymmetric input/output ("I/O") transistor, comprising:

providing a semiconductor substrate having a core transistor region and an I/O transistor region;

forming a first oxide layer outwardly from the semiconductor substrate;

masking a first portion of a gate region of the I/O transistor region and a drain region of the I/O transistor region, the first portion of the gate region less than a whole portion;

removing the first oxide layer from the core transistor region and a second portion of the gate region of the I/O transistor region, the second portion of the gate region less than the whole portion;

removing the first photoresist layer;

forming a second oxide layer outwardly from the substrate in the core transistor region and the second portion of the gate region of the I/O transistor region, and outwardly from the first oxide layer in the first portion of the gate region of the I/O transistor region and the drain region of the I/O transistor region, the first oxide layer having a greater thickness than the second oxide layer;

forming a polysilicon layer outwardly from the second oxide layer;

removing a portion of the polysilicon layer, the second oxide layer, and the first oxide layer to form gates for the core transistor region and the I/O transistor region;

masking the first portion of the gate region of the I/O transistor region and the drain region of the I/O transistor region with a second photoresist layer;

doping a source region and a drain region of the core transistor region and a source region of the I/O transistor region with a first dopant at an energy level of between one to ten keV;

doping the source region and the drain region of the core transistor region and the source region of the I/O transistor region with a second dopant at an energy level of between ten to fifty keV;

removing the second photoresist layer;

masking the core transistor region and the second portion of the gate region of the I/O transistor region with a third photoresist layer; and doping a drain region of the I/O transistor region with a third dopant at an energy level of between five to twenty keV.

16. The method of claim 15, wherein masking the first portion of the gate region of the I/O transistor region comprises masking half of the gate region of the I/O transistor region.

17. The method of claim 15, wherein forming the first oxide layer comprises depositing oxide having a thickness of between 30 and 50 angstroms.

18. The method of claim 15, wherein forming the second oxide layer comprises depositing oxide having a thickness of between 15 and 25 angstroms.

19. The method of claim 15, wherein doping the source region and the drain region of the core transistor region and the source region of the I/O transistor region with a second dopant at the energy level of ten to fifty keV further comprises implanting the second dopant in the source region and the drain region of the core transistor region and in the source region of the I/O transistor region and at an angle of between seven and thirty degrees.

* * * * *